US011950354B2

(12) United States Patent
Laurent et al.

(10) Patent No.: US 11,950,354 B2
(45) Date of Patent: Apr. 2, 2024

(54) INTERNAL ARCHITECTURE OF A COMPUTING DEVICE

(71) Applicant: Apple Inc., Cupertino, CA (US)

(72) Inventors: Kristopher P. Laurent, Portola Valley, CA (US); Brett W. Degner, Menlo Park, CA (US); Jay S. Nigen, Mountain View, CA (US); Eric R. Prather, Portola Valley, CA (US); David H. Narajowski, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/653,634

(22) Filed: Mar. 4, 2022

(65) Prior Publication Data

US 2023/0284372 A1 Sep. 7, 2023

(51) Int. Cl.
*H05K 1/02* (2006.01)
*G06F 1/20* (2006.01)

(52) U.S. Cl.
CPC .......... *H05K 1/0209* (2013.01); *G06F 1/203* (2013.01); *G06F 2200/201* (2013.01); *H05K 2201/064* (2013.01); *H05K 2201/066* (2013.01)

(58) Field of Classification Search
CPC .......... H05K 1/0209; H05K 2201/064; H05K 2201/066; G06F 1/203; G06F 2200/201
See application file for complete search history.

(56) References Cited

U.S. PATENT DOCUMENTS

| 5,832,986 | A | * | 11/1998 | Kenny | .................. H01L 23/467 174/16.3 |
|---|---|---|---|---|---|
| 6,169,659 | B1 | | 1/2001 | Wheaton | |
| 6,282,093 | B1 | | 8/2001 | Goodwin | |
| 7,755,912 | B2 | | 7/2010 | Morita | |
| 7,777,329 | B2 | | 8/2010 | Colbert et al. | |
| 8,644,020 | B2 | | 2/2014 | Lau et al. | |
| 10,147,665 | B2 | | 12/2018 | Park et al. | |
| 10,354,979 | B1 | | 7/2019 | Faoro | |
| 2005/0088818 | A1 | * | 4/2005 | Chou | ................. H05K 7/20172 361/695 |
| 2006/0185836 | A1 | | 8/2006 | Garner | |
| 2008/0045135 | A1 | * | 2/2008 | Pfannenberg | ......... F24F 1/0071 454/184 |

(Continued)

FOREIGN PATENT DOCUMENTS

TW 201038114 A 10/2010

*Primary Examiner* — Michael A Matey
(74) *Attorney, Agent, or Firm* — BAKERHOSTETLER

(57) ABSTRACT

This application relates to a layout of components within an electronic device. The electronic device includes a circuit board and one or more thermal components located on or proximate to each surface of the circuit board. As a result, thermal energy generated by components of the circuit board are drawn away from the circuit board in a more efficient manner. Additionally, the electronic device may include one or more air movers designed to draw ambient air into the electronic device in a manner that causes the ambient air to cool components upstream from the air movers. Further, the electronic device includes a fin stack that is thermally coupled to the aforementioned thermal components, and further receives air driven in by the air mover(s). Also, the electronic device is designed to receive the ambient air through openings that define a 360-degree air inlet.

19 Claims, 11 Drawing Sheets

(56) References Cited

U.S. PATENT DOCUMENTS

| | | | | |
|---|---|---|---|---|
| 2008/0251911 | A1* | 10/2008 | Farnsworth | H01L 23/4093 257/714 |
| 2009/0026813 | A1* | 1/2009 | Lofy | B60N 2/5635 165/104.31 |
| 2011/0303358 | A1* | 12/2011 | Farahani | G06F 1/16 156/361 |
| 2012/0281360 | A1* | 11/2012 | Nicol | G16H 20/13 29/825 |
| 2013/0120926 | A1* | 5/2013 | Barina | H01L 23/4093 165/80.4 |
| 2013/0194745 | A1* | 8/2013 | Meijer | G06F 1/20 361/679.47 |
| 2014/0111914 | A1* | 4/2014 | Leggett | H01H 11/00 361/679.1 |
| 2014/0239488 | A1 | 8/2014 | Kobayashi et al. | |
| 2014/0361893 | A1* | 12/2014 | Degner | G08B 5/36 361/679.54 |
| 2014/0362523 | A1* | 12/2014 | Degner | G06F 1/206 361/679.47 |
| 2014/0362576 | A1* | 12/2014 | Degner | H05K 5/03 362/253 |
| 2016/0227671 | A1* | 8/2016 | Meng | G06F 1/20 |
| 2016/0282913 | A1* | 9/2016 | Degner | G02B 6/0008 |
| 2019/0021184 | A1* | 1/2019 | Williams | F04D 25/0613 |
| 2020/0150729 | A1* | 5/2020 | Whang | H05K 7/20154 |
| 2021/0120670 | A1* | 4/2021 | Tan | H05K 5/0026 |
| 2021/0321543 | A1* | 10/2021 | Tan | G11C 5/04 |
| 2023/0037477 | A1* | 2/2023 | Lastrucci | F21V 33/0056 |

* cited by examiner

INTERNAL ARCHITECTURE OF A COMPUTING DEVICE

FIELD

The described embodiments relate generally to electronic devices. More particularly, the present embodiments relate to a design layout of internal components within electronic devices. The various embodiments show and describe layouts that can enhance thermal efficiency within the electronic devices, as well as efficiencies in space saving.

BACKGROUND

Recent advances in electronic devices provide for increased computing capabilities. This is due in part to, for example, processing circuitry that operates at higher operating frequencies. As a result, modern computing devices can provide faster computations as well as higher quality video output.

However, when the processing circuitry operates at higher frequencies, thermal energy generation increases. This can lead to the computing device having to throttle down, or reduce, the operating frequency to prevent damage to the processing circuitry based on increased thermal energy. Additionally, a trend for smaller form factor computing devices currently exists. This can result in locating components closer to each other, as well as heated air (from the increased thermal energy) occupying a greater portion of space within the electronic device.

SUMMARY

This paper describes various embodiments that relate to electronic devices and the internal architecture/layout of components within electronic devices.

According to some embodiments of the present disclosure, an electronic device is described. The electronic device may include a multi-part housing that is symmetrically disposed about a longitudinal axis. The housing may comprise a first part that defines a first internal volume and has a first opening, a second part separably coupled to the first part that defines a second internal volume axially displaced from the first internal volume and in fluidic communication with the first internal volume such that air flows between the first internal volume and the second internal volume, and a heat removal assembly disposed within the first internal volume. The second part includes a circular base that is centered at the longitudinal axis and includes circumferentially disposed second openings that allow air to pass between an external environment and the second internal volume, and the heat removal assembly has an air mover that is capable of moving an amount of air from the first internal volume, through a heat exchanger, and to the external environment by way of the first opening.

According to some embodiments of the present disclosure, an electronic device is described. The electronic device may include a housing symmetrically disposed about a longitudinal axis, and components disposed within a first internal volume defined by the housing. The components may include a heat exchanger, a printed circuit board (PCB) that includes electrical traces, a PCB first surface that is opposite a PCB second surface, and a circuit assembly (CA) that is secured to the PCB first surface at a CA first surface and electrically coupled to the electrical traces, the circuit assembly having a CA second surface displaced from and generally parallel to the CA first surface. Further, the components may include a heat capture assembly in thermal communication with the heat exchanger. The heat capture assembly may comprise a first part thermally coupled to the CA second surface and a second part thermally coupled to the circuit assembly by way of the PCB second surface, wherein the electrical traces, and the first and second parts are capable of transferring heat generated by the circuit assembly independent of the other.

According to some embodiments of the present disclosure, an electronic device is described. The electronic device may include a multi-part housing that is symmetrically disposed about a longitudinal axis. The housing may comprise a first part that (i) defines a first internal volume and has (ii) a first opening that connects the first internal volume to an external environment. Further, the housing may comprise a second part that is separably coupled to the first part and defines a second internal volume axially displaced from the first internal volume and is in fluidic communication with the first internal volume such that air can flow between the first internal volume and the second internal volume. In addition, the housing may include a heat removal assembly disposed within the first internal volume. The second part has a circular base centered at the longitudinal axis that includes circumferentially disposed second openings that allow air to pass between an external environment and the second internal volume wherein the second openings are characterized as having a size, a shape, and a pitch so as to restrict passage of radio frequency (RF) electromagnetic energy therethrough. Also, the heat removal assembly causes movement of an amount of air from the second internal volume and to the first internal volume, and to the external environment via the first opening. Further, the housing may include electrical components disposed within the second internal volume. The electrical components are capable of generating heat during operation, some of which is captured by the moving air.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
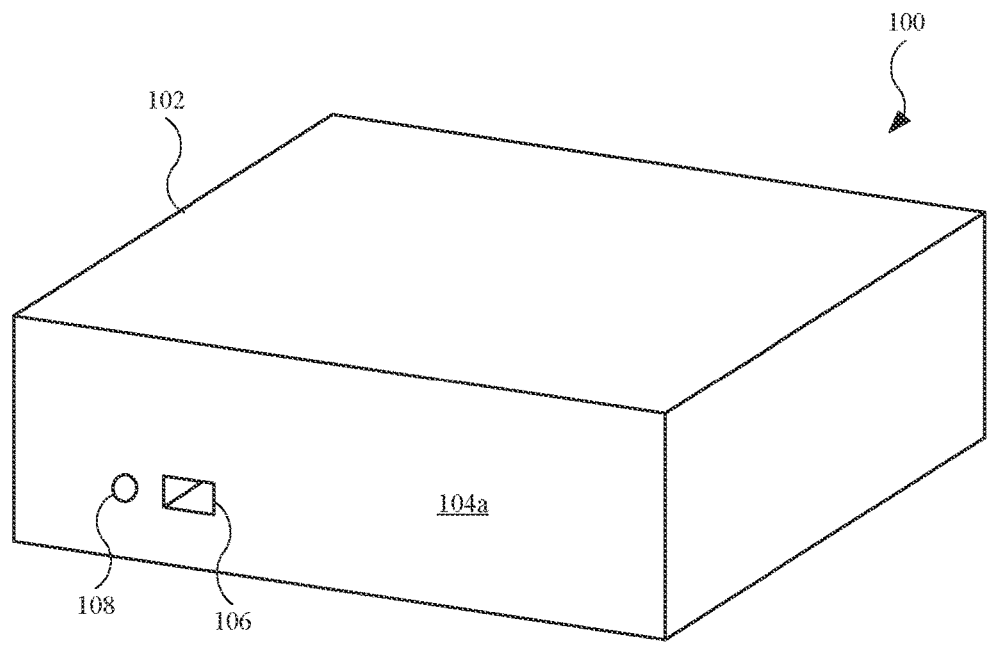
FIG. 1 illustrates an isometric view of an embodiment of an electronic device.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

This application is directed to electronic devices and a modified layout within electronic devices to enhance the overall performance and efficiency. As non-limiting examples, electronic devices described herein may refer to desktop computing devices, laptop computing devices, display devices, and portable electronic devices (e.g., smartphones and tablet computing devices). The modifications and enhancements shown and described for electronic devices provide enhanced efficiency in terms of use of space (within a housing of the electronic device), airflow performance, thermal performance, and noise performance.

Electronic devices described herein include multiple thermal components used to cool heat-generating components (e.g., processing circuits, integrated circuits, voltage regulators) located on a circuit board. In this detailed description and in the claims, a "thermal component" may refer to a device designed to absorb or extract thermal energy (i.e., heat) from a heat-generating component. For example, a thermal component may include a thermal extraction component, a heat transport component, or a thermally conductive component, as non-limiting examples. Examples of thermal extraction components and heat transfer components include a vapor chamber and a heat pipe. Examples of thermally conductive components include a metal, or metal alloy, that relies on its intrinsic properties (i.e., relatively high thermal conductivity) to absorb thermal energy. Copper is an exemplary metal used with a thermally conductive component. Additional examples of thermal components include heat sinks that absorb thermal energy and allow a fluid (e.g., air) to pass through its surfaces. A fin stack is an example of a heat sink.

The heat-generating components may include several high-power (i.e., high energy consumption) integrated circuitry (e.g., system on a chip or SOC, other processing circuitry) that can generate thermal energy during operation. In order to cool and dissipate thermal energy generated by these heat-generating components, some electronic devices include a vapor chamber thermally coupled to an integrated circuit(s) as well as a heat pipe thermally coupled to one or more voltage regulators used to control the voltage to the integrated circuit(s). The integrated circuit(s) and voltage regulator(s) can be positioned on opposite surfaces, or sides, of the circuit board. Moreover, the thermal components may lie on the opposite surfaces of the circuit board. For example, the vapor chamber may lie on one surface of the circuit board to dissipate thermal energy from the integrated circuit(s), while the heat pipe may lie on the other, opposing surface of the circuit board to dissipate thermal energy from the voltage regulator(s). Additionally, the electronic device may include a fin stack thermally coupled to the vapor chamber and the heat pipe. By providing thermal solutions to both surfaces of the circuit board, a single fin stack can be used, thereby saving spacing within the housing or reducing the overall size of the housing and thus the overall size of the electronic device.

Additionally, the circuit board may include a centrally located main logic board ("MLB") within the housing. When the circuit board is centrally located within the housing, the high-power integrated circuits on the circuit board can be more efficiently cooled by, for example, air movers (e.g., blowers or fans) that drive ambient air into the electronic device and around or over multiple surfaces of the circuit board and its components. "Ambient air" refers to air initially in the environment external with respect to the electronic device. Further, several components are located upstream relative to the air movers. In this regard, the air movers cause the ambient air to pass over and/or between the components prior to reaching the air movers.

The electronic device housing may include an airflow inlet and outlet in locations designed to enhance airflow throughout the housing. For example, the airflow inlet may include multiple openings that define (collectively) a circular airflow inlet, thereby providing ambient air with an inlet path that spans 360 degrees. In this regard, the air movers can drive ambient air in into the electronic device from virtually any direction, causing the ambient air to reach (and subsequently cool) the components. Additionally, the airflow outlet may include multiple openings aligned with the fin stack. Also, the outlet of the air movers are aligned with the fin stack. In this regard, the subsequently heated ambient air can pass through the fin stack and then out of the electronic device through the airflow outlet.

These and other embodiments are discussed below with reference to FIGS. 1-13. However, those skilled in the art will readily appreciate that the detailed description given herein with respect to these figures is for explanatory purposes only and should not be construed as limiting.

FIG. 1 illustrates an isometric view of an embodiment of an electronic device 100. Electronic device 100 may include a desktop computing device, including a personal desktop computing device. However, in other embodiments, electronic device 100 may take the form of various computing devices, such as a laptop computing device, a mobile wireless communication device, a tablet computing device, or a display device, as non-limiting examples.

Electronic device 100 includes a housing 102, or enclosure, that provides an internal volume (or storage location) for several internal components of electronic device 100. Housing 102 may include a metal housing, composed of aluminum, stainless steel, or a metal alloy. Housing 102 may alternatively be formed from one or more non-metals. Housing 102 includes several surfaces, or sides. As shown, housing 102 includes a surface 104a that provides an area for several input/output ("I/O") ports. For example, electronic device 100 includes an I/O port 106 and an indicator 108. I/O port 106 may include a particular I/O port, such as Universal Serial Bus ("USB"), solid state drive ("SSD") port, Ethernet, or a High-Definition Multimedia Interface ("HDMI") port, as non-limiting examples. Although a single I/O port is shown, I/O port 106 may represent several additional I/O ports. Indicator 108 may include a light source. When illuminated, indicator 108 may signal that electronic device 100 is on or whether I/O port 106 is in use.

Figure 2:
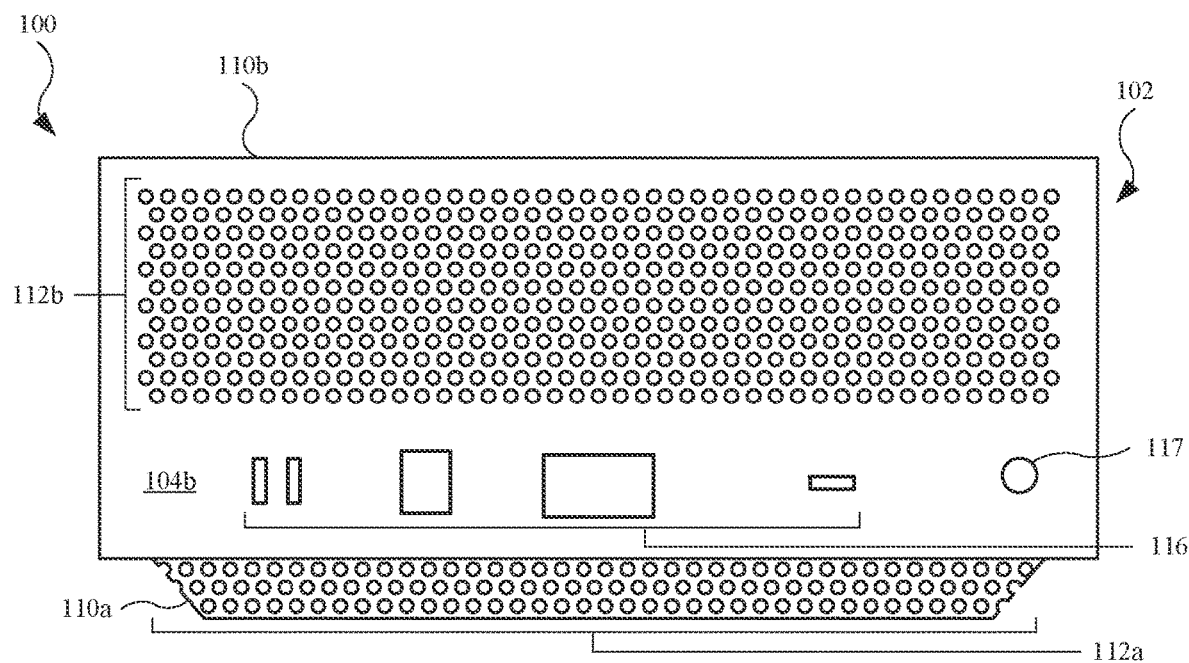
FIG. 2 illustrates a side view of the electronic device.

FIG. 2 illustrates a side view of electronic device 100. Housing 102 includes multiple housing components. For example, housing 102 may include a housing component 110a coupled with a housing component 110b. Housing component 110a provides a base, while housing component 110b is used to store several internal components. As shown, housing components 110a and 110b include openings 112a and openings 112b, respectively. Openings 112a and 112b each include a set of openings, each of which defining multiple through holes in the housing components 110a and 110b, respectively. Based on the design, openings 112a provide an airflow inlet for ambient air used to cool several internal components, while openings 112b provide an airflow outlet for the ambient air to exit electronic device 100. Additionally, based on the design, housing component 110a elevates housing component 110b and provides substantial area for openings 112a. These features will be shown and described in further detail below. Also, the diameter of each of the openings 112a and 112b are large enough for airflow transmission, but small enough to protect against issues such as fires (internally within electronic device 100) and electromagnetic interference ("EMI") into or out of electronic device 100.

Further, housing component 110b includes a surface 104b that provides an area for openings 112b and I/O ports 116. I/O ports 116 may each include any type of port previously described for I/O port 106 (shown in FIG. 1). Additionally, electronic device 100 may include a power button 117. Also, based on the design, surface 104b and surface 104a (shown in FIG. 1) may be parallel, opposing surfaces, of housing component 110b.

Figure 3:
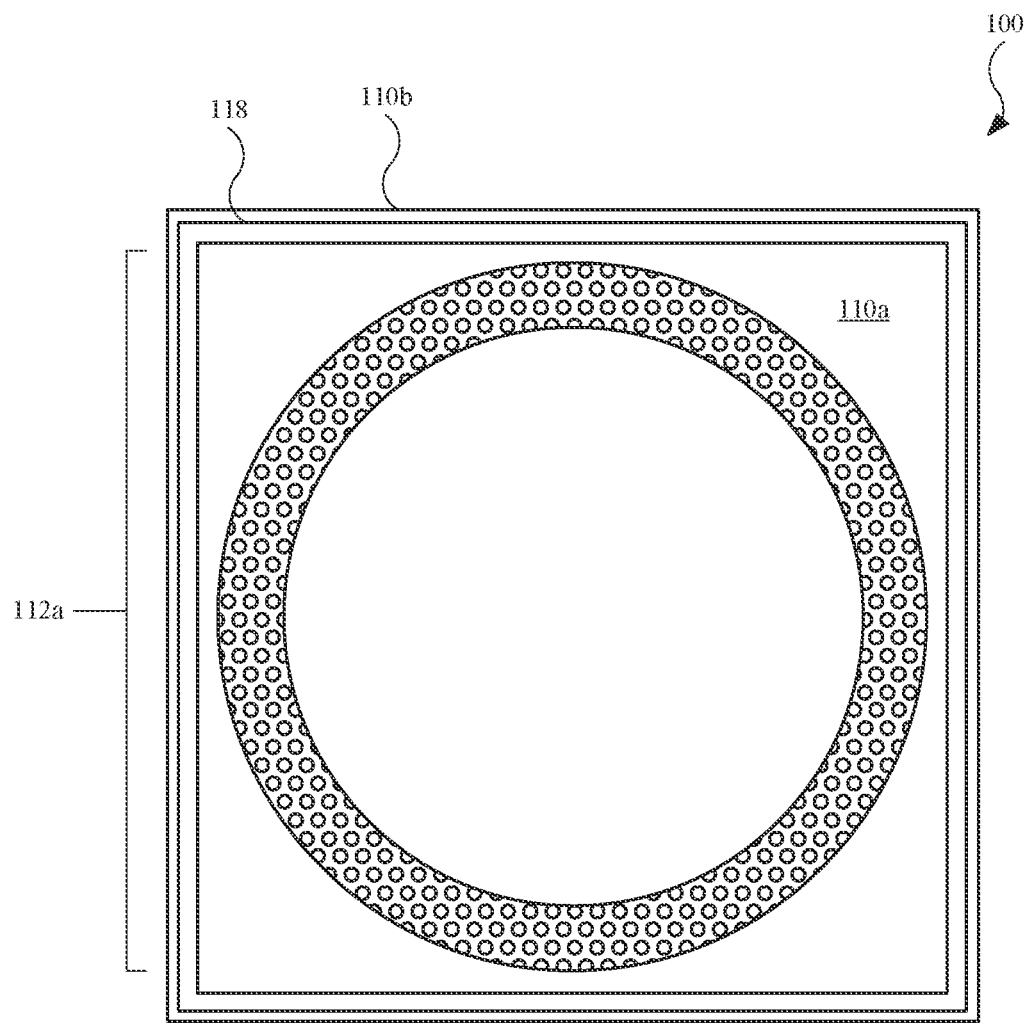
FIG. 3 illustrates a bottom view of the electronic device.

FIG. 3 illustrates a bottom view of electronic device 100. As shown, openings 112a in housing component 110a define a circular, 360-degree airflow inlet. Referring again to FIG. 2, the airflow inlet (i.e., openings 112a) can receive ambient air from virtually any direction based on the 360-degree design. Moreover, by elevating housing component 110b, housing component 110a provides space for the 360-degree airflow inlet.

Also, electronic device 100 may include wireless communication capabilities that uses one or more antennas (discussed below). As a result, electronic device 100 may include a radio transparent material 118 that represents one or more non-metals, such as plastic, resin, or a combination thereof, as non-limiting examples. In this manner, housing components 110a and 110b may include metal, while radio transparent material 118 provides a separation between housing components 110a and 110b and permits radio frequency ("RF") transmission to and from the antennas of electronic device 100.

Figure 4:
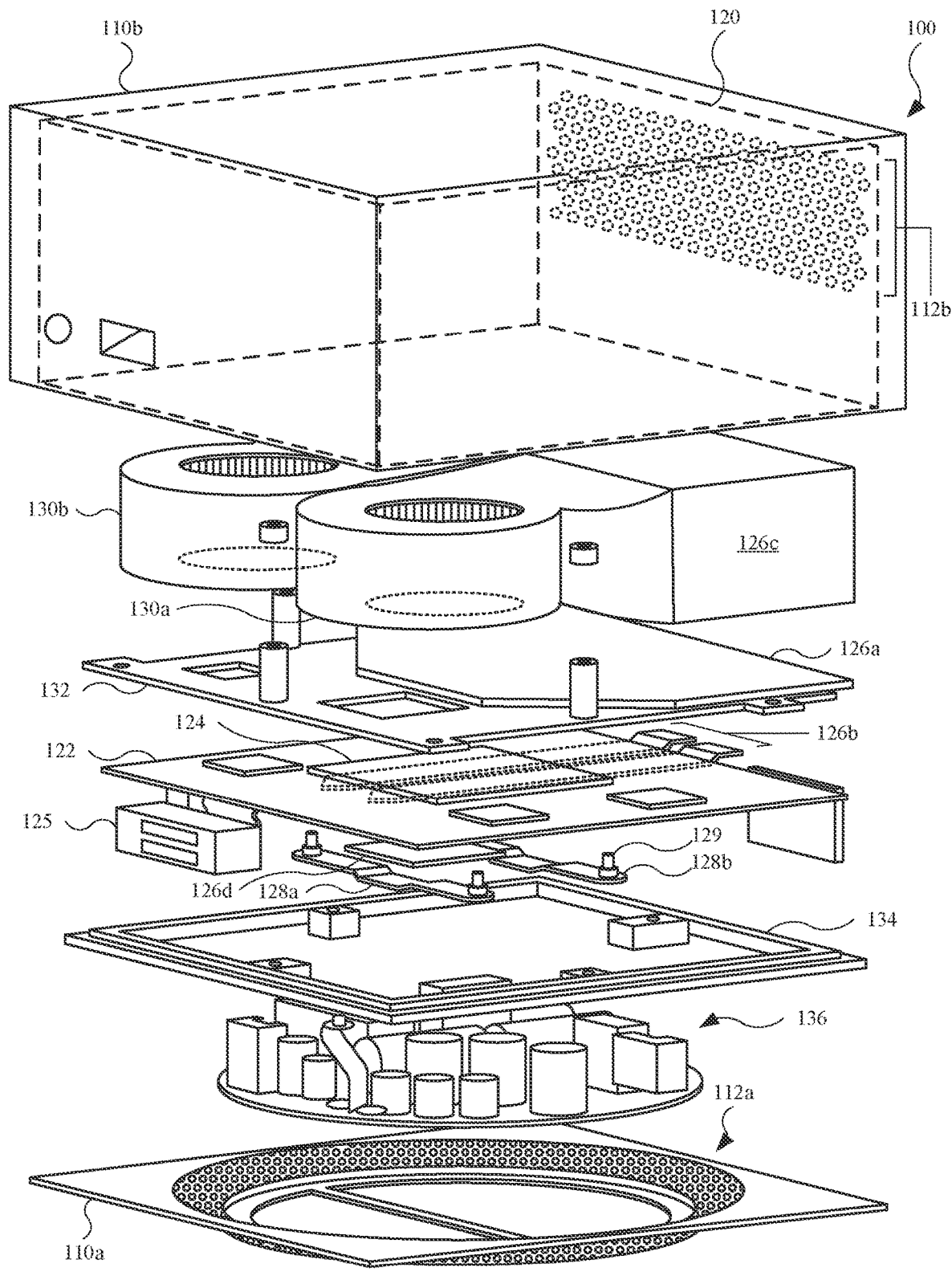
FIG. 4 illustrates an exploded view of the electronic device, showing various internal features.

FIG. 4 illustrates an exploded view of electronic device 100, showing various internal features. For purposes of simplicity, some components are not shown. Also, although not explicitly shown, the various components of electronic device 100 can be coupled together by, for example, fasteners, solder, clips, and/or adhesives. As shown, housing components 110a and 110b substantially define the exterior of electronic device 100, while housing component 110b defines an internal volume 120, or space, for several internal components shown in FIG. 4 and discussed herein.

Electronic device 100 include a circuit board 122 that may define a motherboard or MLB. Circuit board 122 carries, and is electrically connected to, several electrical components, including (but not limited to), processing circuits (including integrated circuits), memory circuits, and flexible circuits. As shown, circuit board 122 carries an integrated circuit 124. Integrated circuit 124 may represent one or more processing circuits. For example, integrated circuit 124 may include a system on a chip ("SOC") used to integrate several components of electronic device 100. Also, an SSD 125 is electrically coupled to, and mechanically suspended from, circuit board 122.

During operation, at least some electrical components can generate significant thermal energy (i.e., heat). For example, based on the computing capabilities (i.e., processing frequency), integrated circuit 124 generates thermal energy during use. Ideally, the thermal energy is dissipated, or drawn away, from integrated circuit 124 to prevent integrated circuit 124 from a throttling down event or from damage. In order to prevent these scenarios, electronic device 100 includes several thermal components. For example, electronic device 100 includes a thermal component 126a in thermal communication with the integrated circuit 124, and a thermal component 126b (shown substantially as dotted lines) thermally coupled to another component(s) (not shown in FIG. 4). When assembled, thermal components 126a and 126b are stationed on, or positioned on or over or proximate to, opposing surfaces or sides of circuit board 122. As a result, thermal energy generated on one surface of circuit board 122 (by integrated circuit 124, for example) can be removed by thermal component 126a, while thermal component 126b can remove thermal energy from voltage regulators (not shown in FIG. 4) on the opposing surface of circuit board 122. In some embodiments, thermal component 126a is a vapor chamber and thermal component 126b is a heat pipe. However, other thermal components are possible. Also, in some embodiments, thermal component 126a and 126b can be interchanged such that the vapor chamber and heat pipe are in different locations. Also, in some embodiments, both thermal component 126a and 126b can include heat pipes or vapor chambers.

Additionally, electronic device 100 may include a thermal component 126c that is in thermal communication with thermal components 126a and 126b. In some embodiments, thermal component 126c includes a fin stack. Accordingly, at least some thermal energy generated by integrated circuit 124 can be dissipated in part by thermal component 126c.

Further, by positioning thermal components 126a and 126b at opposing surfaces or sides of circuit board 122 and placing thermal component 126c in thermal communication with thermal components 126a and 126b, thermal component 126c can, in some embodiments, be limited to a single thermal component (i.e., a single fin stack).

Also, electronic device 100 may further include a thermal component 126d secured directly or indirectly with circuit board 122. For example, thermal component 126d may include a heat spreader formed from a metal (e.g., copper), wherein the heat spreader is mechanically coupled to a stiffener component (not shown) using, for example, one or more fasteners (not shown). Further, the stiffener component may be mechanically coupled to the circuit board 122 by, for example, solder. Accordingly, thermal component 126d is designed to draw thermal energy away from integrated circuit 124. Moreover, electronic device 100 may further include several voltage regulators (discussed above) positioned between circuit board 122 and thermal component 126d. According to one exemplary configuration, the voltage regulators may be positioned between the stiffener component and heat spreader 126d. Thermal component 126d can dissipate thermal energy generated by the voltage regulators. Additionally, with respect to this particular configuration, thermal component 126b may comprise a heat pipe that is soldered to the heat spreader 126d.

Further, the electronic device 100 may include a spring 128a and a spring 128b. As shown and described below, when assembled, the springs 128a and 128b provide a compressive force to improve the thermal contact or communication between the thermal components 126a, 126b, 126c, and 126d, and the heat generating components of the electronic device.

Additionally, electronic device 100 includes an air mover 130a and an air mover 130b. Air movers 130a and 130b may include blowers or fans, including centrifugal blowers or fans. Air movers 130a and 130b are designed to draw ambient air into electronic device 100 via openings 112a, causing the ambient air to move throughout electronic device 100 and convectively cool several components of electronic device 100. The ambient air is subsequently drawn into a respective pair of fan inlets (shown, not labeled), or openings, of air movers 130a and 130b. Air movers 130a and 130b each include a fan outlet (not shown in FIG. 4) aligned with thermal component 126c. As a result, the ambient air is heated while moving throughout electronic device 100 and subsequently expelled through the thermal component 126c, and then out of electronic device 100 via openings 112b. While two air movers are shown, the number of air movers may vary in other embodiments.

Electronic device 100 further includes a chassis 132 designed to hold several components. In some embodiments, chassis 132 is secured with housing component 110b (when electronic device 100 is assembled) by, for example, fasteners, clips, and/or adhesives. Also, chassis 132 is connected to, and holds, thermal components 126a and 126c, as well as air movers 130a and 130b. Additionally, circuit board 122 is coupled to, and suspended from, chassis 132. Based on the design layout, various components are stationed/positioned on or over opposing surfaces or sides of chassis 132. For example, thermal component 126a and air movers 130a and 130b are coupled to one surface of chassis 132, while circuit board 122 is coupled to an opposing surface of chassis 132. Chassis 132 may be formed from a thermally conductive material, such as a metal. In this regard, chassis 132 can be thermally coupled to, or in thermal communication with, thermal components 126a, 126b, 126c, and 126d.

Electronic device 100 further includes a plate 134 used as a support structure and designed to carry several components. For example, electronic device 100 further includes a power supply unit 136, or PSU, designed to convert alternating current ("AC") to low-voltage regulated direct current ("DC") to power the internal components of electronic device 100. Power supply unit 136 can be coupled to, and suspended from, plate 134. Plate 134 can carry one or more antennas, which will be shown below. Also, plate 134 can be coupled to, and suspended from, circuit board 122.

Figure 5:
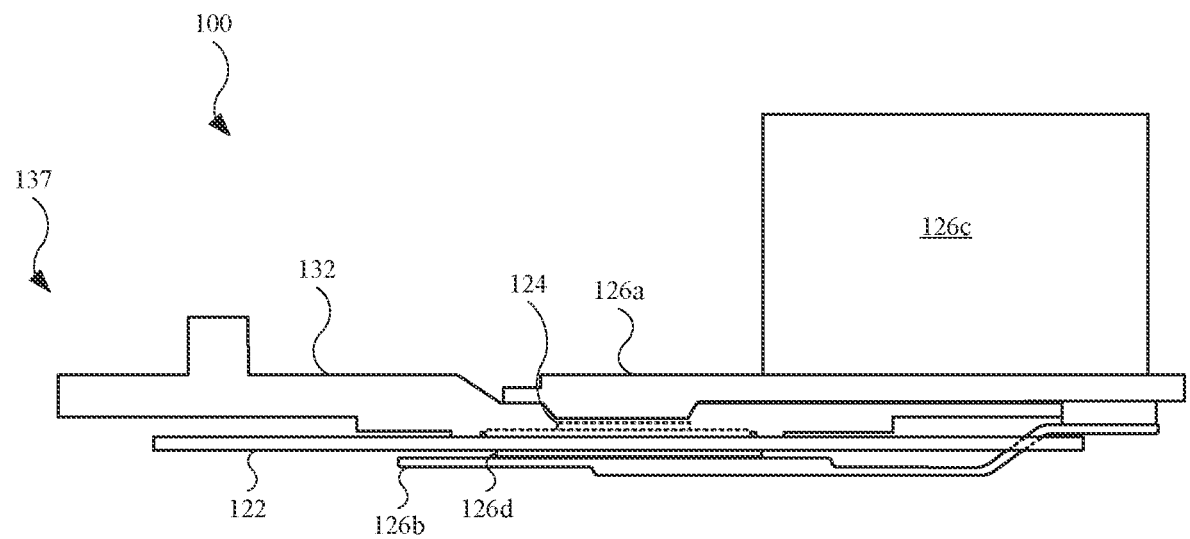
FIG. 5 illustrates a side view of the electronic device, showing the thermal components assembled, in accordance with some described embodiments.

FIG. 5 illustrates a side view of electronic device 100, showing thermal components 126a, 126b, 126c, and 126d assembled, in accordance with some described embodiments. Thermal components 126a, 126b, 126c, and 126d can represent a thermal assembly 137, which may define a subassembly of electronic device 100. Additionally, chassis 132 and air movers 130a and 130b (shown in FIG. 4) can also make up thermal assembly 137. Thermal components 126a and 126c are positioned on or over circuit board 122 (with thermal component 126c stacked on thermal component 126a), while thermal components 126b and 126d are positioned on or over another, opposing surface of circuit board 122. Accordingly, both major surfaces or sides of circuit board 122 can be cooled. Additionally, thermal components 126a and 126c can be coupled to one surface of chassis 132, while circuit board 122 and thermal components 126b and 126d can be coupled directly or indirectly to another, opposing surface of chassis 132. Also, FIG. 5 shows thermal components 126a, 126b, 126c, and 126d can combine to surround circuit board 122 and chassis 132.

In some embodiments, thermally assembly 137 provides a modular system that carries several thermal components. Using chassis 132 to carry at least some of the thermal components, thermal assembly 137 may provide a subassembly that advantageously decreases manufacturing time and assembly of electronic device 100.

Figure 6:
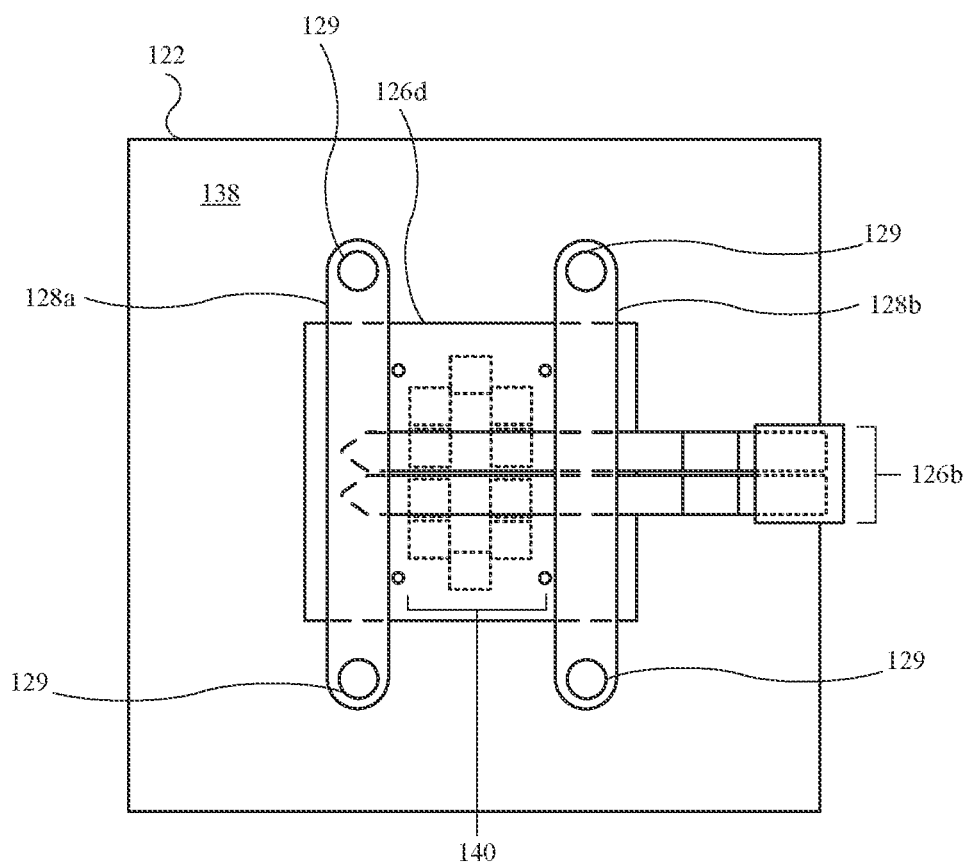
FIG. 6 illustrates a plan view of several thermal components assembled to the circuit board, in accordance with some described embodiments.

FIG. 6 illustrates a plan view of several thermal components assembled relative to circuit board 122, in accordance with some described embodiments. As shown, circuit board 122 includes a surface 138 (representing one of two major surfaces of circuit board 122). As is mentioned above, circuit board 122 may carry one or more voltage regulators 140 (shown as dotted lines) on surface 138. Voltage regulators 140 are used to control voltage to components, such as integrated circuit 124 (shown in FIG. 4). When assembled, springs 128a and 128b may be coupled to the chassis 132 using one or more fasteners 129 (as shown in FIG. 4) such that the integrated circuit 124, circuit board 122, and at least thermal components 126b and 126a are, in effect, sandwiched between the chassis 132 and springs 128a and 128b. Thus, the compressive force resulting from the mechanical coupling between chassis 132 and springs 128a and 128b improves the efficiency and effectiveness of the thermal contact or thermal communication between the heat generating components of the electronic device and the thermal components 126a, 126b, 126c, and 126d. It should be noted that, according to certain embodiments, each of fastener(s) 129 may comprise a threaded bolt at the spring (128a and/or 128b) that, when assembled, is matingly received by a holder component at the chassis 132, wherein the holder component may be spring-loaded.

Figure 7:
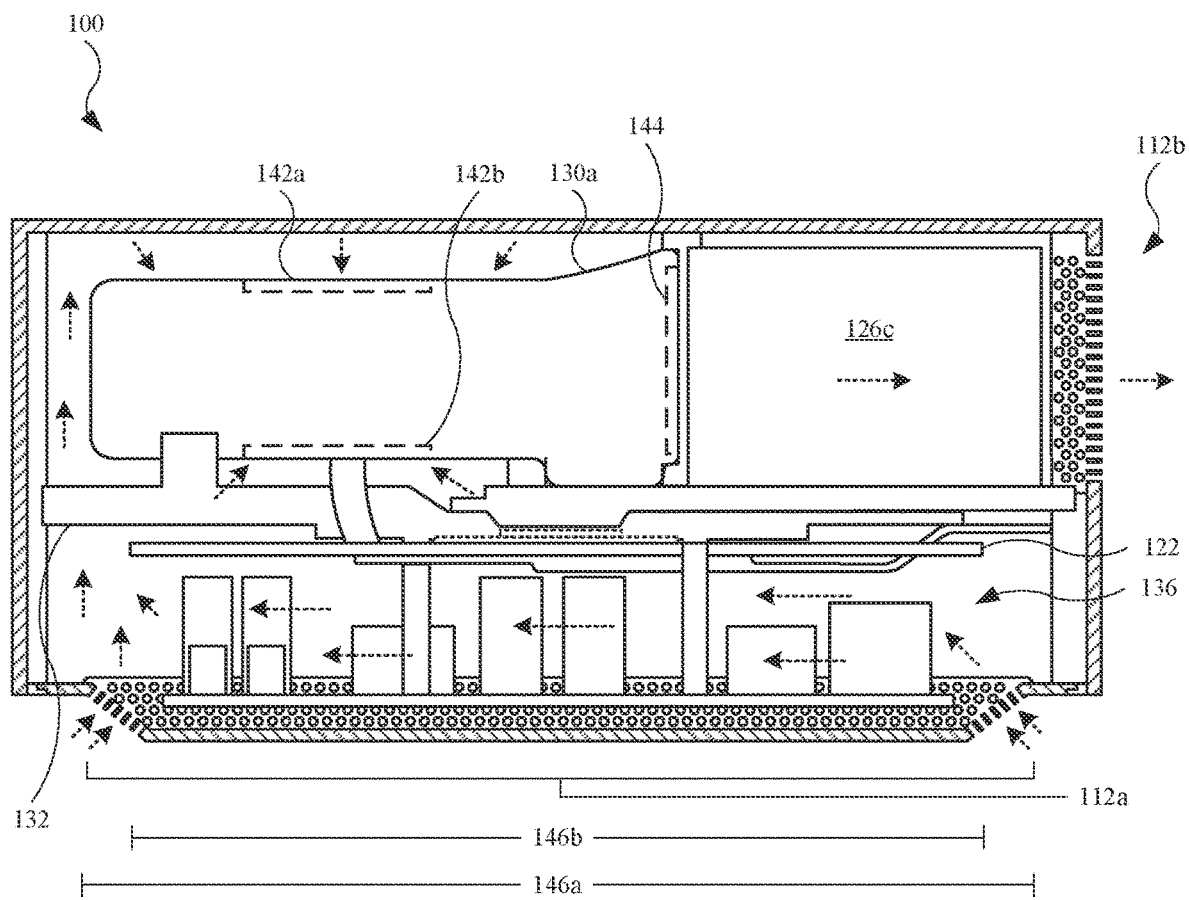
FIG. 7 illustrates a partial cross-sectional view of the electronic device, showing airflow passing through the electronic device and at least some of its various components.

FIG. 7 illustrates a partial cross-sectional view of electronic device 100, showing airflow passing through electronic device 100 and at least some of its various components. For purposes of simplicity, some components of electronic device 100 are removed. The dotted lines with arrows represent airflow of ambient air through electronic device 100. In this regard, during operation, air movers 130a and 130b (the latter shown in FIG. 4) each include impellers (not shown) that are rotationally driven, thereby driving ambient air into electronic device 100 via openings 112a. While air mover 130b is not shown in FIG. 7, it should be noted that air mover 130b can operate in a similar manner as that of air mover 130a, and can include any features as those of air mover 130a. Based on its relative position, power supply unit 136 can initially receive the ambient air. The ambient air can cool power supply unit 136, while also passing between and/or around the various components of power supply unit 136, where the ambient air can subsequently pass through and/or around chassis 132 to cool other components of electronic device 100.

Also, the ambient air passes around multiple surfaces of circuit board 122, thus providing cooling to circuit board 122 and at least some of the components located on circuit board 122. After cooling at least some components, the ambient air is driven into fan inlets 142a and 142b of air mover 130a. The ambient air is then driven out of a fan outlet 144 of air mover 130a. As shown, fan outlet 144 is aligned with thermal component 126c. As a result, the ambient air is expelled out of fan outlet 144 to thermal component 126c. The ambient air can convectively cool thermal component 126c, which draws thermal energy received by thermal components 126a and 126b (shown in FIG. 4). The ambient air can subsequently pass through thermal component 126c and be expelled out of electronic device 100 via openings 112b, based on the alignment between thermal component 126c and openings 112b.

FIG. 7 further shows relationships between components that take advantage of the space and thermal efficiency of electronic device 100. For example, based on their relative positions in electronic device 100, air movers 130a and 130b are designed to "pull" the ambient air into electronic device 100, causing the ambient air to flow around and over respective surfaces of circuit board 122 and power supply unit 136. In other words, circuit board 122 and power supply unit 136 are upstream relative to air movers 130a and 130b.

Referring again to FIG. 3, power supply unit 136, as well as other components, can receive the ambient air in many different directions due to the openings 112a providing a 360-degree airflow inlet. Also, in some embodiments, a dimension 146a, or width, of openings 112a (collectively) is greater than a dimension 146b, or width, representing a maximum dimension of circuit board 122 or power supply unit 136. As a result, openings 112a surround each of circuit board 122 and power supply unit 136, thereby providing greater access to the ambient air, as circuit board 122 and power supply unit 136 do not substantially obstruct the flow of ambient air to other components. Regarding power supply unit 136, dimension 146b can represent a diameter of power supply unit 136, and accordingly power supply unit 136 may include a circular PSU. When dimension 146b is smaller than dimension 146a, the circular design of power supply unit 136 generally does not impede airflow, as compared to square and rectangular PSU's.

Figure 8:
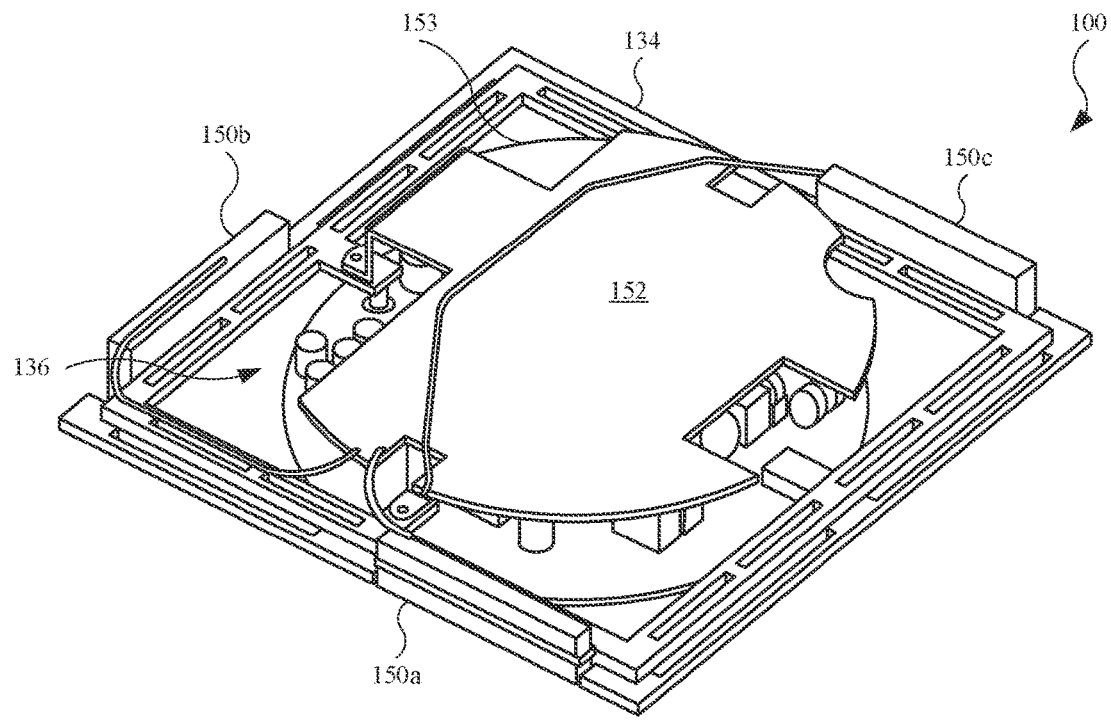
FIG. 8 illustrates an isometric view of several antennas, in accordance with some described embodiments.

FIG. 8 illustrates an isometric view of several antennas of electronic device 100, in accordance with some described embodiments. Electronic device 100 may include an antenna 150a, an antenna 150b, and an antenna 150c. Antennas 150a, 150b, and 150c are used by electronic device 100 for wireless communication. Accordingly, each of antennas 150a, 150b, and 150c can be designed for at least one specific RF, and support communication in accordance with protocol such as BLUETOOTH®, WIFI®, near-field communication ("NFC®"), or the like. Accordingly, electronic device 100 can communicate by multiple communication protocols using antennas 150a, 150b, and 150c. Plate 134 includes several openings, some of which receive a respective antenna of antennas 150a, 150b, and 150c. Plate 134 can provide separation between antennas 150a, 150b, and 150c, in a manner that prevents RF interference among antennas 150a, 150b, and 150c. Also, plate 134 can orient at least some of antennas 150a, 150b, and 150c orthogonally relative to each other, further providing increased separation. When electronic device 100 is assembled, antennas 150a, 150b, and 150c may secure with housing component 110b (shown in FIG. 4) by fasteners, clips, or other securing mechanisms, as non-limiting examples. In an alternate embodiment, plate 134 carries antennas 150a, 150b, and 150c.

Also, electronic device 100 further includes a shield 152 used to provide an insulation or barrier for the components of power supply unit 136. In this manner, shield 152 can block interference (e.g., EMI) from components on circuit board 122 (not shown in FIG. 8), and may also block interference from power supply unit 136 to components on circuit board 122. Additionally, shield 152 can be modified to allow other components to fit within housing 102 (shown in FIG. 1) in a desired manner. For example, referring to FIG. 4, SSD 125 is suspended from circuit board 122. Shield 152 includes a recessed region 153 that defines a non-planar portion of shield 152. In this regard, SSD 125 can be positioned in housing 102 without contacting shield 152, while receiving the benefits of shield 152. Also, SSD 125 can be cooled as the ambient air can pass around shield 152 based on recessed region 153.

Figure 9:
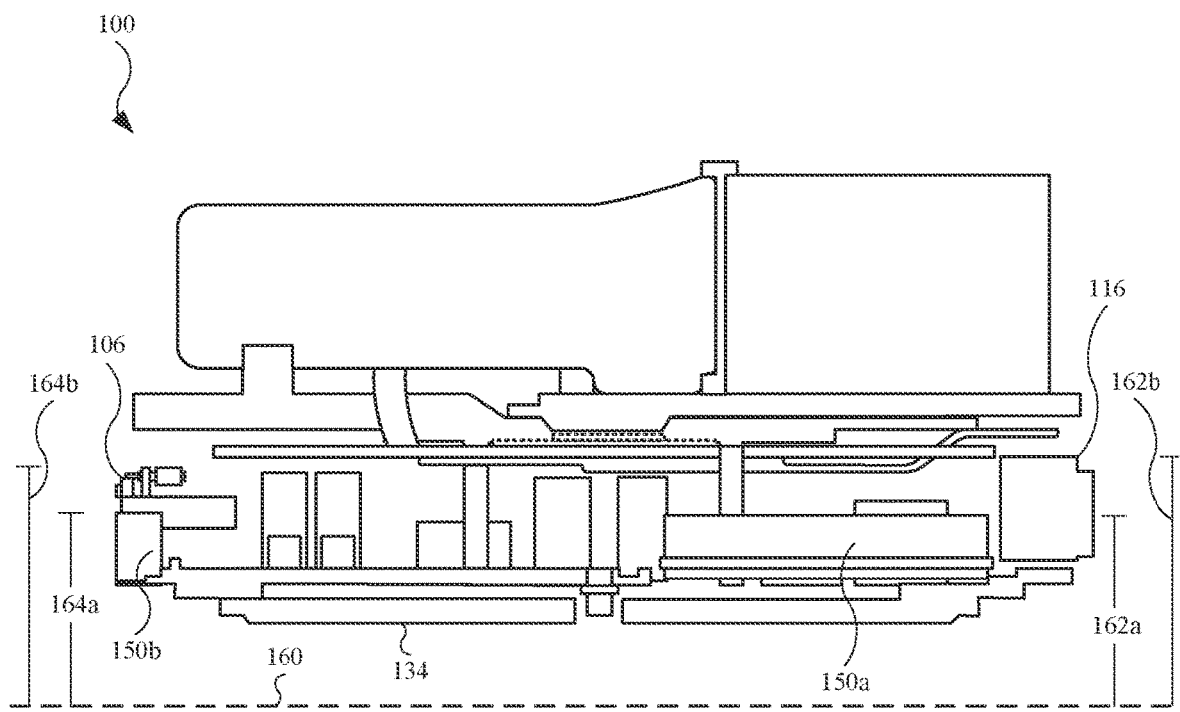
FIG. 9 illustrates a side view of the electronic device, showing the antenna in relation to other internal components, in accordance with some described embodiments.

FIG. 9 illustrates a side view of electronic device 100, showing antennas of electronic device 100 in relation to other internal components, in accordance with some described embodiments. As shown, antennas 150a and 150b are positioned relative to I/O port 106 and I/O ports 116. Based on the design of plate 134, antennas 150a and 150b, as well as antenna 150c (not shown in FIG. 9) are offset with respect to I/O ports 106 and 116. In other words, antennas 150a, 150b, and 150c lie on a different plane as that of I/O ports 106 and 116. For example, an imaginary line 160 is used as a reference from which dimensions 162a, 162b, 164a, and 164b are drawn. A dimension 162a (i.e., height or elevation from imaginary line 160) of antenna 150a is smaller than a dimension 162b of I/O ports 116. Similarly, a dimension 164a of antenna 150b is smaller than a dimension 164b of I/O port 106. This offset relationship prevents issues such as de-sensitization of antennas 150a, 150b, and 150c.

Figure 10:
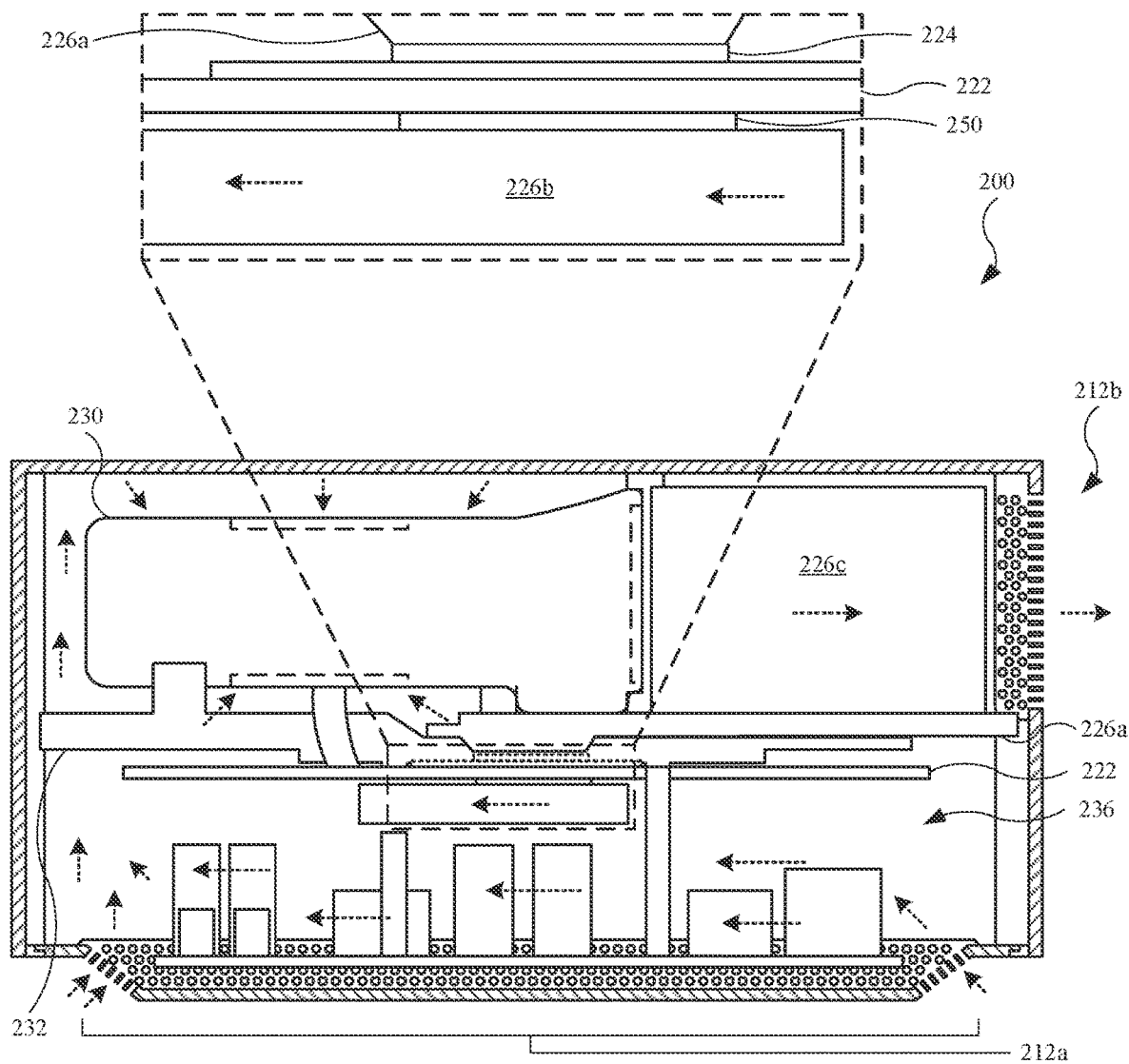
FIG. 10 illustrates a partial cross-sectional view of an alternate embodiment of an electronic device, showing an alternate configuration of thermal components.

FIG. 10 illustrates a partial cross-sectional view of an alternate embodiment of an electronic device 200, showing an alternate configuration of thermal components. Electronic device 200 may include any components and structures, along with their associated features, described for electronic device 100 (shown in prior Figures). However, for purposes of simplicity, some components of electronic device 200 are removed.

Similar to a prior embodiment, electronic device 200 includes a circuit board 222. As shown in the enlarged view, circuit board 222 carries an integrated circuit 224 on a surface and voltage regulators 250 (representative of one or more voltage regulators) on an opposing surface. In order to extract thermal energy generated by integrated circuit 224, electronic device 200 includes a thermal component 226a that is thermally coupled to integrated circuit 224. In some embodiments, thermal component 226a includes a vapor chamber. Also, in order to extract thermal energy generated by voltage regulators 250, electronic device 200 includes a thermal component 226b that is thermally coupled to voltage regulators 250. In some embodiments, thermal component 226b includes a fin stack. Also, electronic device 200 includes a thermal component 226c that is thermally coupled to thermal component 226a, thereby allowing thermal component 226c to extract thermal energy received by thermal component 226a. In some embodiments, thermal component 226c includes a fin stack.

Electronic device 200 further includes a chassis 232 designed to carry several components. For example, chassis 232 carries an air mover 230 (representative of one or more air movers), as well as other components described herein. During operation, air mover 230 includes impellers (not shown) that are rotationally driven, thereby driving ambient air into electronic device 200 via openings 212a. The dotted lines with arrows represent airflow of ambient air through electronic device 200. As shown, the ambient air can pass through thermal component 226b. As a result, thermal component 226b, when taking the form of a fin stack, can extract thermal energy from voltage regulators 250, and can be cooled by the ambient air (drawn into electronic device 200) that passes through thermal component 226b. Also, the ambient air can cool a power supply unit 236 of electronic device 200. The ambient air can pass between and/or around the various components of power supply unit 236. Additionally, the ambient air passes through and/or around chassis 232 to subsequently cool other components of electronic device 200.

Also, the ambient air passes around multiple surfaces of circuit board 222, thus providing cooling to circuit board 222 and at least some of the components located on circuit board 222. After cooling at least some components, the ambient air is driven into one or more fan inlets (shown, not labeled) of air mover 230. The ambient air is then driven out of a fan outlet (shown, not labeled) of air mover 230. The ambient air is expelled out of air mover 230 to thermal component 226c. The ambient air can pass through and convectively cool thermal component 226c, and can subsequently be expelled out of electronic device 200 via openings 212b, based on the alignment between thermal component 226c and openings 212b. FIG. 10 shows that different thermal components can be substituted into an electronic device, and provide different methods of cooling heat-generating components.

In accordance with an embodiment, there is an electronic device that includes a multi-part housing, symmetrically disposed about a longitudinal axis. The multi-part housing includes a first part that defines a first internal volume and has a first opening, a second part that is separably coupled to the first part and defines a second internal volume axially displaced from the first internal volume and in fluidic communication with the first internal volume such that air flows between the first internal volume and the second internal volume, wherein the second part includes a circular base centered at the longitudinal axis and includes circumferentially disposed second openings that allow air to pass between an external environment and the second internal volume. Further, the housing includes a heat removal assembly disposed within the first internal volume, wherein the heat removal assembly—has an air mover capable of moving an amount of air from the first internal volume, through a heat exchanger, and to the external environment by way of the first opening. It should be further noted that the air mover creates a pressure differential between the first and second internal volumes such that the amount of air moves: (i) from the external environment through the second openings into the second internal volume, and (ii) from the second internal volume to the first internal volume. The electronic device also includes electronic components disposed within the second internal volume that are capable of generating an amount of electronic component heat during operation. Moreover, the amount of air moving through the second internal volume to the first internal volume captures at least some of the electronic component heat.

Further, in the described embodiment, the second openings are characterized as having a size, a shape, and a pitch so as to restrict passage of radio frequency (RE) electromagnetic energy therethrough.

Additionally, in the described embodiment, e air mover includes a dual fan assembly capable of creating the pressure differential.

It should also be noted that within the first internal volume is disposed a circuit assembly that has a mounting surface that is secured to a first surface of a substrate having electrical traces, and a surface that is displaced from and is generally parallel to the mounting surface, and a heat capture assembly in thermal communication with the heat exchanger, wherein the heat capture assembly has a first part thermally coupled to a second surface opposite the first surface of the substrate and a second part thermally coupled to the generally parallel surface. Further, the first and second parts of the heat capture assembly are each capable of independently capturing at least some of an amount of circuit assembly heat generated by the circuit assembly during operation thereof. Further, in the described embodiment, the first part of the heat capture assembly comprises a heat pipe assembly or a fin stack, and the second part includes a vapor chamber. Additionally, the heat pipe assembly comprises a heat spreader between the second surface and a heat pipe, and the electrical traces form a heat path between the heat spreader and the first surface.

In accordance with an embodiment of an electronic: device described herein, the electronic device includes a housing symmetrically disposed about a longitudinal axis. Further, the electronic device includes components disposed within a first internal volume defined by the housing, wherein the components include a heat exchanger, a printed circuit board (PCB) that includes electrical traces and a PCB first surface that is opposite a PCB second surface, a circuit assembly (CA) that—is secured to the PCB first surface at a CA first surface and electrically coupled. to the electrical traces, wherein the circuit assembly has a CA second surface displaced from and generally parallel to the CA first surface, and a heat capture assembly in thermal communication with the heat exchanger, wherein the heat capture assembly has a first part thermally coupled to the CA second surface and a second part thermally coupled to the circuit assembly by way of the PCB second surface, wherein the electrical traces and the first and second parts are capable of transferring heat that is generated by the circuit assembly independent of the other.

In the described embodiment, the heat exchanger includes a fin stack having a heat fin capable of transferring heat to an amount of air in thermal contact therewith. In addition, the second part of the heat capture assembly includes a heat pipe assembly comprising a heat spreader that is secured (for example, by way of a stiffener component) to the PCB at the PCB second surface, and a heat pipe attached to the heat spreader. It should be noted that the first part of the heat capture assembly includes a vapor chamber in thermal contact with the CA second surface and a spring fastener assembly capable of applying a compressive force to the thermal contact between the vapor chamber and the CA second surface. Moreover, the heat exchanger further includes an air mover capable of moving the amount of air through the heat exchanger.

In accordance with an embodiment of an electronic device described herein, the electronic device comprises a multi-part housing that is symmetrically disposed about a longitudinal axis. The multi-part housing comprises a first part that (i) defines a first internal volume and has (ii) a first opening that connects the first internal volume to an external environment, a second part separably coupled to the first part and that defines a second internal volume axially displaced from the first internal volume and in fluidic communication with the first internal volume such that air flows between the first internal volume and the second internal volume, the second part having a circular base centered at the longitudinal axis that includes circumferentially disposed second openings that allow air to pass between an external environment and the second internal volume, wherein the second openings are characterized as having a size, a shape, and a pitch so as to restrict passage of radio frequency (RE) electromagnetic energy therethrough.

Further, a heat removal assembly is disposed within the first internal volume, wherein the heat removal assembly causes movement of an amount of air from the second internal volume to the first internal volume, and then to the external environment via the first opening, and electrical components disposed within the second internal volume, wherein the electrical components are capable of generating heat during operation, some of which is captured by the moving air. It should be noted that the heat removal assembly includes an air mover and a heat exchanger, wherein the air mover creates a pressure differential between the first and the second internal volumes such that the amount of air moves (i) from the external environment through the second openings into the second internal volume, and (ii) from the second internal volume to the first internal volume. It should be noted that the heat exchanger includes a fin stack, and the air mover includes a dual fan assembly.

Figure 11A:
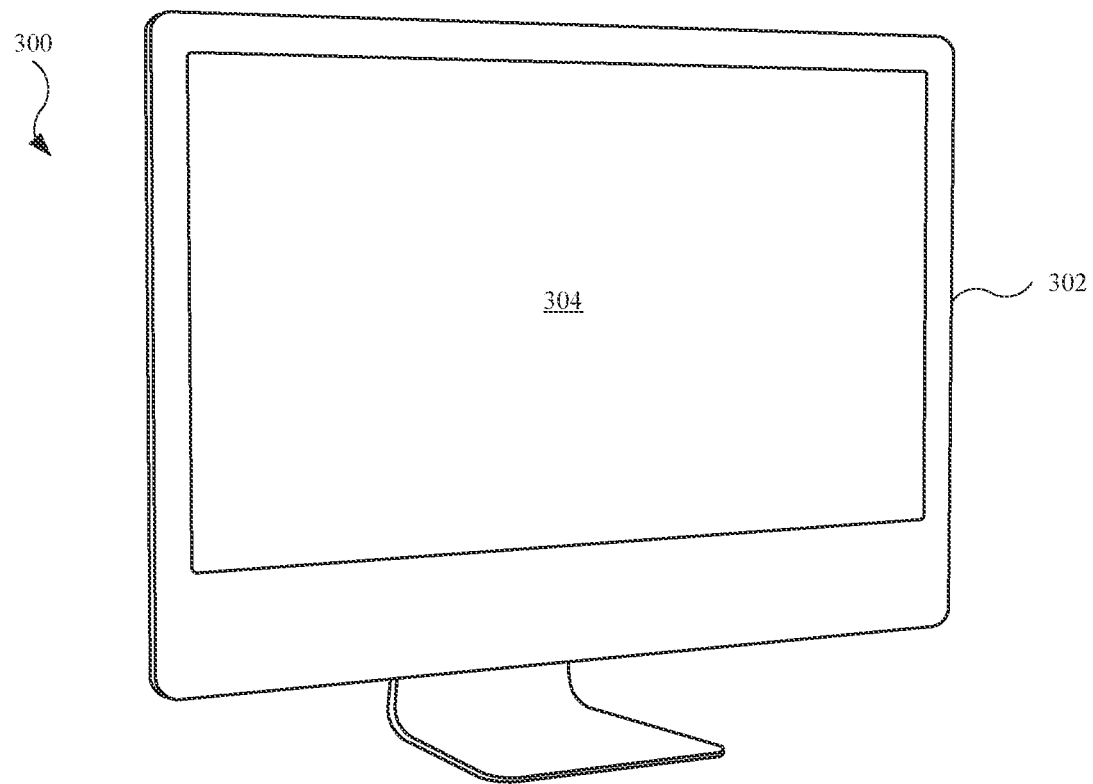
FIGS. 11A-11C illustrate alternate embodiments of electronic devices that may include internal components described herein.
Figure 11B:
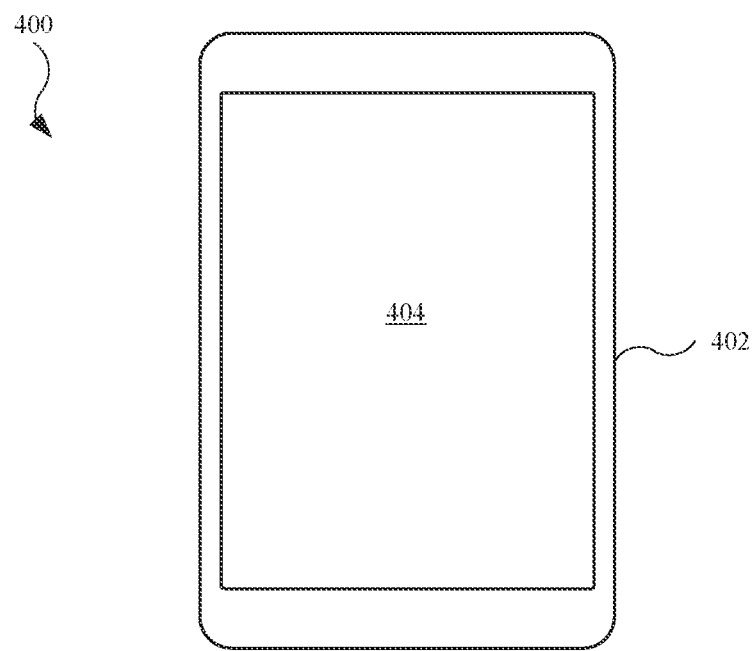
Figure 11C:
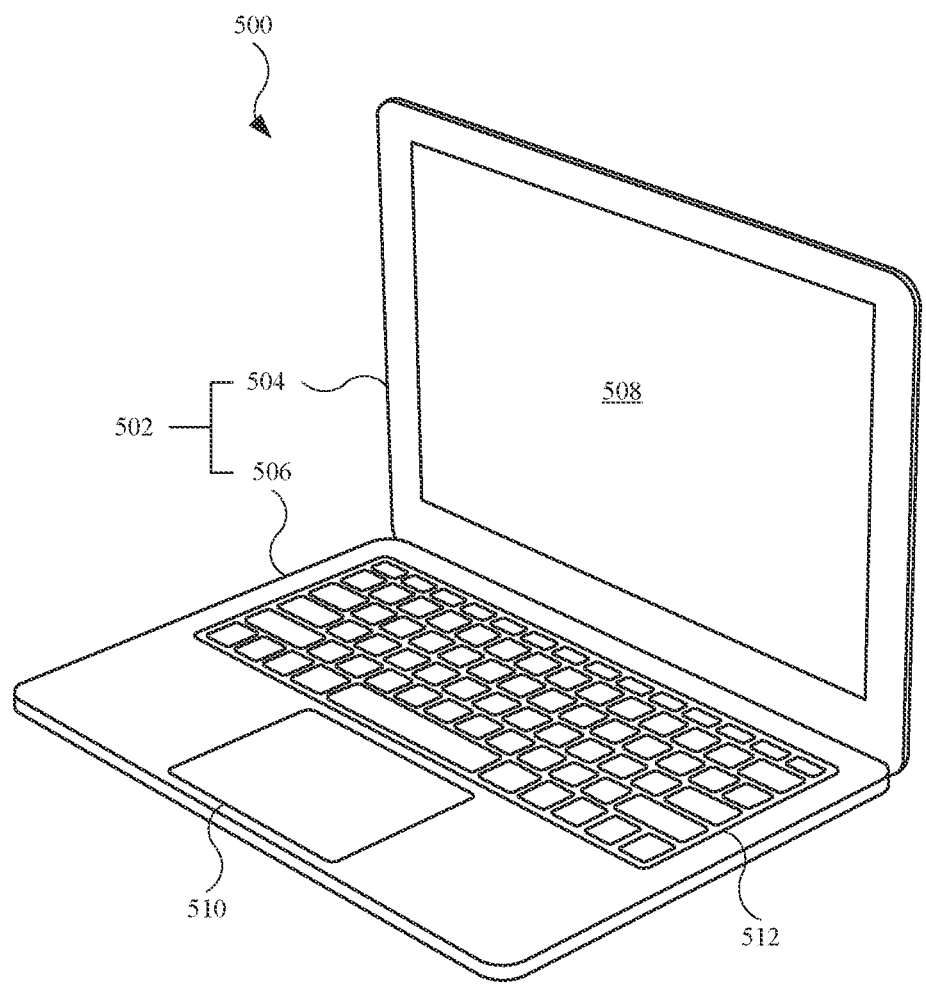

FIGS. 11A-11C illustrate alternate embodiments of electronic devices that may include internal components described herein. FIG. 11A illustrates an isometric view of an alternate embodiment of an electronic device 300 that can take the form of a standalone display or a desktop computer with a display. As shown, electronic device 300 includes a housing 302 and a display 304 coupled to housing 302. Housing 302 can define an internal volume to carry one or more components described herein for electronic devices. Also, although not shown, electronic device 300 may work in conjunction (wired or wireless) with accessories, such as a mouse and a keyboard. Although not shown, electronic device 300 may further include one or more I/O features (e.g., buttons, switches, ports).

FIG. 11B illustrates a plan view of an alternate embodiment of an electronic device 400 that can take the form of a mobile wireless communication device (e.g., smartphone) or a tablet computing device. As shown, electronic device 400 includes a housing 402 and a display 404 coupled to housing 402. Housing 402 can define an internal volume to carry one or more components described herein for electronic devices. Although not shown, electronic device 400 may further include one or more I/O features (e.g., buttons, switches, docks/ports) and display 404 may include a capacitive touch input display.

FIG. 11C illustrates a plan view of an alternate embodiment of an electronic device 500 that can take the form of a laptop computing device. As shown, electronic device 500 includes a housing 502 that includes a display housing 504 and a base portion 506 rotationally coupled to display housing 504. Also, display housing 504 carries a display 508, and base portion 506 includes a track pad 510 and a keyboard 512, both of which can be used as inputs. Housing 502 can define an internal volume to carry one or more components described herein for electronic devices. Although not shown, electronic device 500 may further include one or more I/O features (e.g., buttons, switches, docks/ports).

Figure 12:
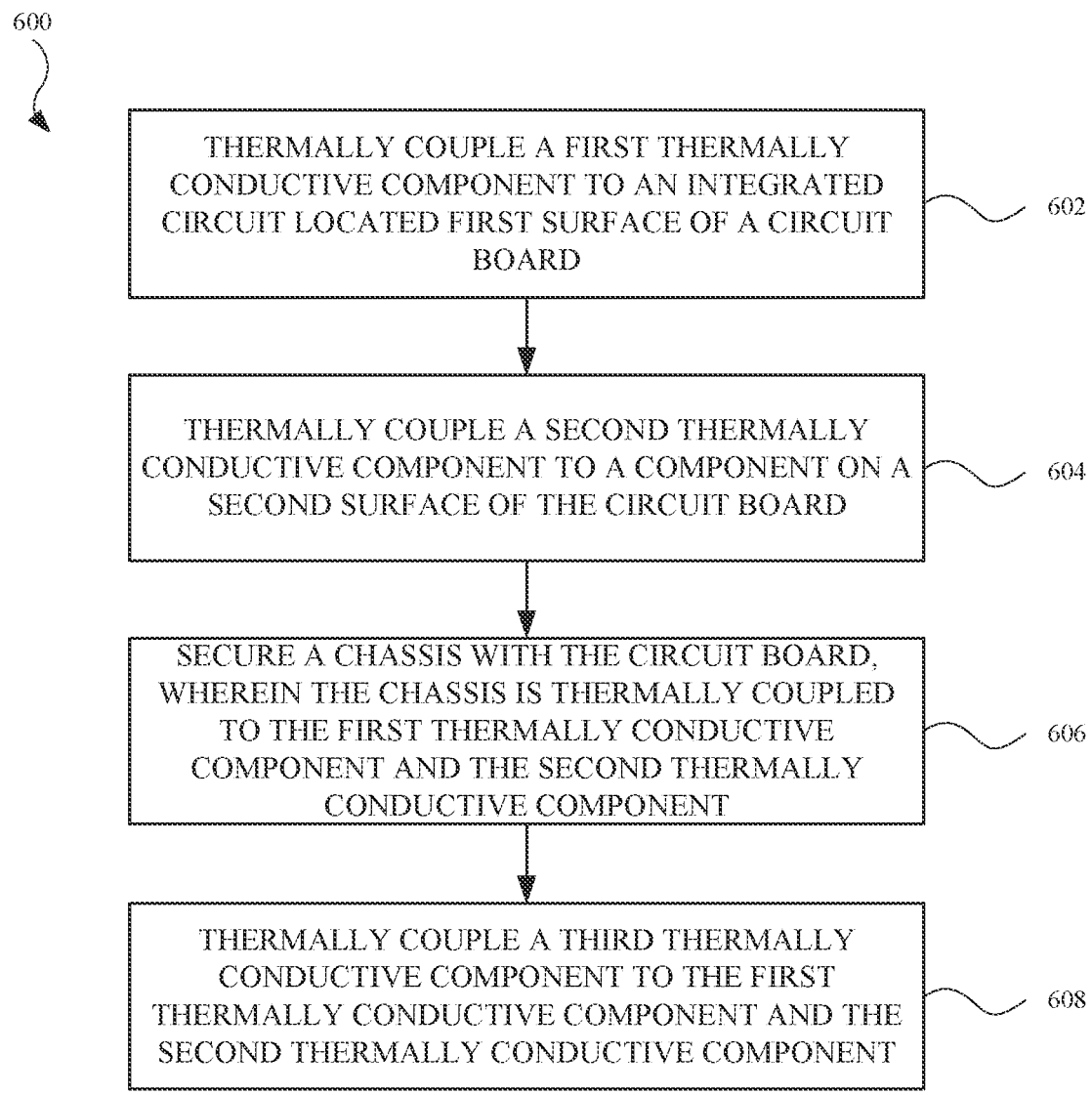
FIG. 12 illustrates a flowchart showing a method for assembling an electronic device, in accordance with some described embodiments.

FIG. 12 illustrates a flowchart 600 showing a method for assembling an electronic device, in accordance with some described embodiments. The method shown and described in flowchart 600 can be implemented in the electronic devices described herein.

In step 602, a first thermal component is thermally coupled to an integrated circuit located on a first surface of a circuit board. In some embodiments, the first thermal components includes a vapor chamber. Also, the integrated circuit may include an SOC.

In step 604, a second thermal component is thermally coupled to a component on a second surface of the circuit board. The second surface is opposite the first surface. The component may represent one or more voltage regulators used to control voltage to the integrated circuit. Also, the second thermal component may include a heat pipe. Additionally, other thermal components (e.g., heat spreader) can be thermally coupled to the component. By having thermal components on multiple surfaces of the circuit board, the circuit board and its components can be cooled more efficiently.

In step 606, a chassis is secured with the circuit board. The chassis is thermally coupled to the first thermal component and the second thermal component. Additionally, one or more air movers can be secured with the chassis. Moreover, the air mover(s) and the circuit board may be positioned on or over opposing sides of the chassis.

In step 608, a third thermal component is thermally coupled to the first thermal component and the second thermal component. The third thermal component may include a fin stack.

Figure 13:
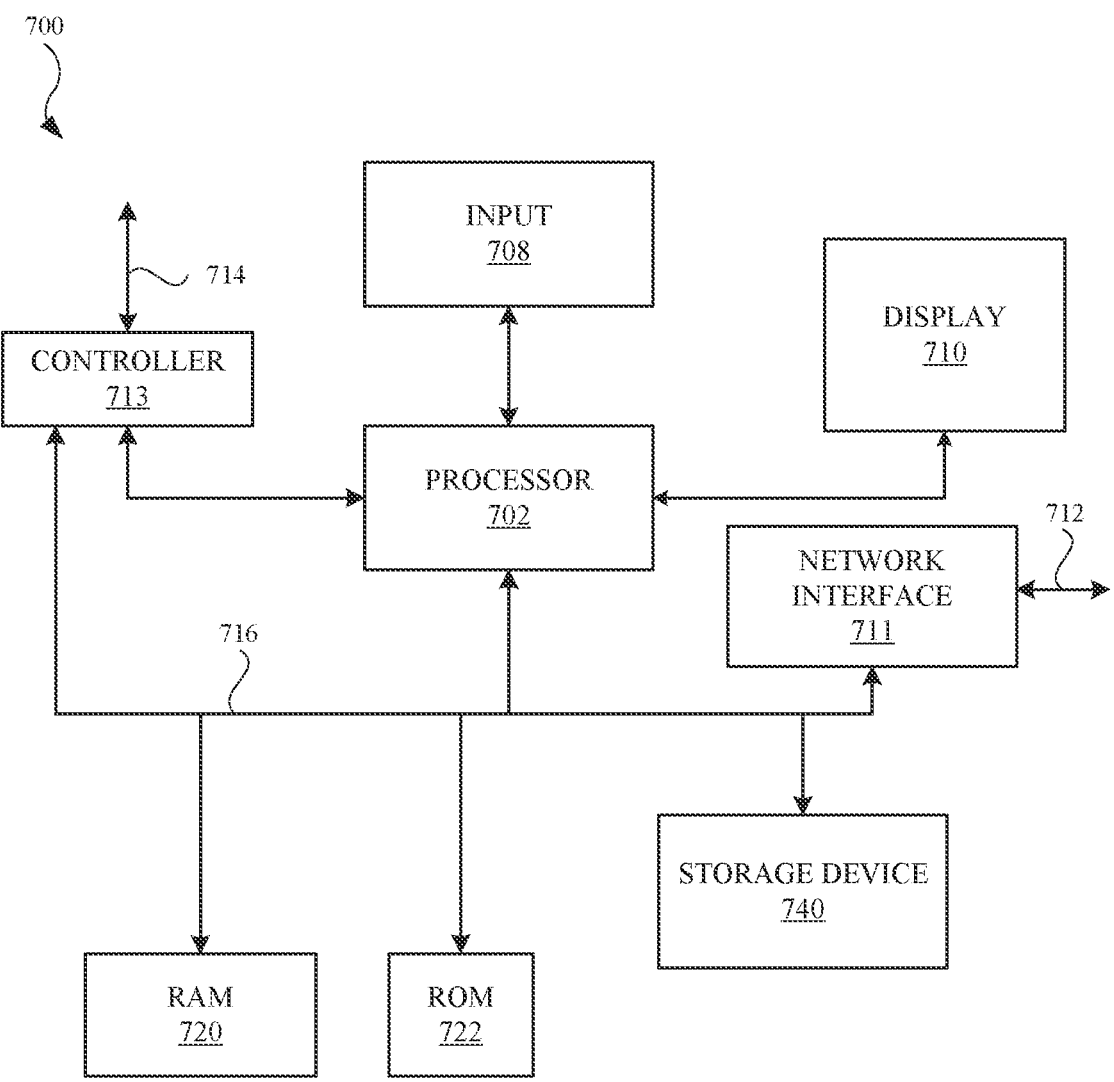
FIG. 13 illustrates a block diagram of an electronic device, in accordance with some described embodiments.

FIG. 13 illustrates a block diagram of an electronic device 700, in accordance with some described embodiments. The details shown for electronic device 700 can be used to implement the various techniques described herein, according to some embodiments. In particular, FIG. 13 shows components that can be included in electronic devices described herein. As shown in FIG. 13, electronic device 700 can include a processor 702 that represents a microprocessor or controller for controlling the overall operation of electronic device 700. Electronic device 700 can also include a user input device 708 that allows a user of electronic device 700 to interact with electronic device 700. For example, user input device 708 can take a variety of forms, such as a button, keypad, dial, touch screen, audio input interface, visual/image capture input interface, input in the form of sensor data, and so on. Still further, electronic device 700 can include a display 710 that can be controlled by processor 702 (e.g., via a graphics component) to display information to the user. A data bus 716 can facilitate data transfer between at least a storage device 740, processor 702, and a controller 713. Controller 713 can be used to interface with and control different equipment through an equipment control bus 714. Electronic device 700 can also include a network/bus interface 711 that couples to a data link 712. In the case of a wireless connection, network/bus interface 711 can include a wireless transceiver.

As noted above, electronic device 700 also includes storage device 740, which may include a single disk or a collection of disks (e.g., hard drives). In some embodiments, storage device 740 can include flash memory, semiconductor (solid state) memory or the like. Electronic device 700 can also include a Random-Access Memory (RAM) 720 and a Read-Only Memory (ROM) 722. ROM 722 can store programs, utilities or processes to be executed in a non-volatile manner. RAM 720 can provide volatile data storage, and stores instructions related to the operation of applications executing on electronic device 700.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
    a multi-part housing, comprising:
        a first part that defines a first internal volume and has a first opening,
        a second part separably coupled to the first part, the second part defining a second internal volume in fluidic communication with the first internal volume such that air flows between the first internal volume and the second internal volume, wherein the second part includes a circular base and includes circumferentially disposed second openings that allow air to pass between an external environment and the second internal volume,
    a power supply unit partially positioned in the second internal volume, and
    an air mover capable of moving an amount of air from the second internal volume, through the power supply unit, and to the external environment by way of the first opening.

2. The electronic device as recited in claim 1, wherein the air mover creates a pressure differential between the first and second internal volumes such that the amount of air moves: (i) from the external environment through the circumferentially disposed second openings into the second internal volume, and (ii) from the second internal volume to the first internal volume.

3. The electronic device as recited in claim 1, further comprising electronic components disposed within the second internal volume that are capable of generating an amount of electronic component heat during operation.

4. The electronic device as recited in claim 3, wherein the amount of air moving through the second internal volume to the first internal volume captures at least some of the amount of electronic component heat.

5. The electronic device as recited in claim 1, wherein the circumferentially disposed second openings are characterized as having a size, a shape, and a pitch so as to restrict passage of radio frequency (RF) electromagnetic energy therethrough.

6. The electronic device as recited in claim 1, wherein the air mover includes a dual fan assembly capable of creating a pressure differential.

7. The electronic device as recited in claim 1, further including within the first internal volume:
    a circuit assembly having a mounting surface secured to a first surface of a substrate, and a surface displaced from and generally parallel to the mounting surface,
    a first part thermally coupled to a second surface opposite the first surface of the substrate, and
    a second part thermally coupled to the surface.

8. The electronic device as recited in claim 7, wherein the first and second parts are each capable of independently capturing at least some of an amount of circuit assembly heat generated by the circuit assembly during operation thereof.

9. The electronic device as recited in claim 8, wherein the first past comprises a heat pipe or a fin stack, and wherein the second part includes a vapor chamber.

10. The electronic device as recited in claim 9, further comprising a heat spreader between the second surface and a heat pipe.

11. The electronic device as recited in claim 10, wherein the substrate comprises electrical traces form a heat path between the heat spreader and the first surface.

12. An electronic device, comprising:
    a housing; and
    components, disposed within a first internal volume defined by the housing, include:
        a chassis comprising a first side and a second side opposite the first side,
        a printed circuit board coupled to the first side,
        a first thermal component coupled to the first side, wherein the printed circuit board is positioned between the first thermal component and the chassis,
        a second thermal component coupled to the second side,
        a vapor chamber in thermal contact with the printed circuit board at the second surface, and
        a spring fastener assembly capable of applying a compressive force to the thermal contact between the vapor chamber and the printed circuit board.

13. The electronic device as recited in claim 12, further comprising a fin stack having a heat fin capable of transferring heat to an amount of air in thermal contact therewith.

14. The electronic device as recited in claim 12, further comprising:
- a heat spreader secured to the printed circuit board at a surface of the printed circuit board, and
- a heat pipe attached to the heat spreader.

15. The electronic device as recited in claim 14, further comprising an air mover capable of moving the amount of air through the housing.

16. An electronic device, comprising:
- a multi-part housing, comprising:
  - a first part that defines a first internal volume and comprises a first set of openings that connects the first internal volume to an external environment,
  - a second part separably coupled to the first part defines a second internal volume in fluidic communication with the first internal volume such that air can flow between the first internal volume and the second internal volume, the second part having a circular base that includes circumferentially disposed second set of openings that allow air to pass between an external environment and the second internal volume, wherein the second set of openings are characterized as having a size, a shape, and a pitch so as to restrict passage of radio frequency (RF) electromagnetic energy therethrough,
- an air mover, and
- a fin stack positioned between the air mover and the first set of openings.

17. The electronic device as recited in claim 16, further comprising an air mover, wherein the air mover creates a pressure differential between the first and second internal volumes such that an amount of air moves: (i) from the external environment through the second set of openings into the second internal volume, and (ii) from the second internal volume to the first internal volume.

18. The electronic device as recited in claim 17, wherein the fin stack comprises a single fin stack.

19. The electronic device as recited in claim 17, wherein the air mover includes a dual fan assembly.

* * * * *

UNITED STATES PATENT AND TRADEMARK OFFICE
CERTIFICATE OF CORRECTION

PATENT NO. : 11,950,354 B2
APPLICATION NO. : 17/653634
DATED : April 2, 2024
INVENTOR(S) : Kristopher P. Laurent et al.

Page 1 of 1

It is certified that error appears in the above-identified patent and that said Letters Patent is hereby corrected as shown below:

In the Claims

Column 16; Line No. 41 (Claim 9): "first past comprises" should read --first part comprises--;

Column 16; Line No. 58 (Claim 12): "the chassis," should read --the chassis, and--.

Signed and Sealed this
Eighteenth Day of June, 2024

Katherine Kelly Vidal
*Director of the United States Patent and Trademark Office*